(12) United States Patent
Park

(10) Patent No.: US 7,311,488 B2
(45) Date of Patent: Dec. 25, 2007

(54) SYSTEM AND METHOD FOR CONVEYING FLAT PANEL DISPLAY

(75) Inventor: Yong-Seok Park, Seoul (KR)

(73) Assignee: DMS Co., Ltd., Kyungki-do (KR)

( * ) Notice: Subject to any disclaimer, the term of this patent is extended or adjusted under 35 U.S.C. 154(b) by 403 days.

(21) Appl. No.: 10/967,428

(22) Filed: Oct. 18, 2004

(65) Prior Publication Data
US 2005/0089388 A1    Apr. 28, 2005

(30) Foreign Application Priority Data
Oct. 28, 2003 (KR) ...................... 10-2003-0075365

(51) Int. Cl.
*B60L 11/08* (2006.01)
(52) U.S. Cl. ..................................... 414/663
(58) Field of Classification Search ................ 414/217, 414/225, 226, 543, 222.01, 663, 805; 271/35, 271/131, 165
See application file for complete search history.

(56) References Cited

U.S. PATENT DOCUMENTS

| | | | | |
|---|---|---|---|---|
| 4,141,458 A | * | 2/1979 | Brooks et al. | 414/331.18 |
| 4,673,456 A | * | 6/1987 | Spencer et al. | 156/345.36 |
| 4,687,403 A | * | 8/1987 | Motoda | 414/788.4 |
| 5,364,219 A | * | 11/1994 | Takahashi et al. | 414/217 |
| 5,431,600 A | * | 7/1995 | Murata et al. | 454/187 |
| 5,570,990 A | * | 11/1996 | Bonora et al. | 414/543 |
| 5,655,869 A | * | 8/1997 | Scheler et al. | 414/222.01 |
| 6,019,563 A | * | 2/2000 | Murata et al. | 414/222.01 |
| 6,205,881 B1 | * | 3/2001 | Gravell et al. | 74/483 R |
| 6,454,512 B1 | * | 9/2002 | Weiss | 414/663 |
| 6,524,057 B1 | * | 2/2003 | Park | 414/663 |
| 6,592,318 B2 | * | 7/2003 | Aggarwal | 414/217.1 |
| 6,599,077 B2 | * | 7/2003 | McCrandall et al. | 414/331.11 |
| 6,692,214 B1 | * | 2/2004 | Shida et al. | 414/416.03 |
| 2002/0154974 A1 | * | 10/2002 | Fukuda et al. | 414/416.01 |

* cited by examiner

*Primary Examiner*—Charles A Fox
(74) *Attorney, Agent, or Firm*—Barnes & Thornburg LLP

(57) ABSTRACT

A panel conveying system includes a panel cassette for receiving a plurality of panels, and a conveying vehicle for conveying the panel cassette. The conveying vehicle includes a loading/unloading unit installed on the main body to load and/or unload the panel cassette on and/or from a panel processing unit, a panel conveying unit installed on the main body to feed and/or collect the panels to and/or from a panel processing area, and a lifting unit supporting the panel cassette in the main body.

8 Claims, 17 Drawing Sheets

SYSTEM AND METHOD FOR CONVEYING FLAT PANEL DISPLAY

BACKGROUND OF THE INVENTION a) Field of the Invention

The present invention relates to a system and method for conveying a flat panel display, and more particularly, to a system and method for conveying a flat panel display that can be save working space and improve process and equipment efficiency.

b) Description of the Related Art

Generally, panels such as a flat panel display, a semiconductor wafer, a liquid crystal display, and a photo mask glass are processed through a series of processes such as deposition, etching, stripping, cleaning, and rinsing processes. Such processes are performed in a cleaning room, each having a processing area.

FIG. 16 shows a conventional panel conveying system.

Processing apparatuses 100 for performing the processes are arranged in a clean room R to improve process efficiency.

Conveying units 110 are set on the process apparatuses 100 in response to a panel feeding area 120 so that the panels can be effectively supplied into the panel process area of the apparatuses 100. For example, the conveying units are comprised of a buffer or conveyer unit for vertical and horizontal movements of the panels.

The panel is received in a panel cassette 140 in a panel storing area 130 spaced away from the panel feeding area 120 in the clean room R. The panel received in the panel cassette 140 is conveyed to the panel feeding area 120 through a panel conveying system.

The panel conveying system comprises a conveying vehicle V such as an auto guarded vehicle that moves between the panel storing area 130 and the panel feeding area 120. The panel cassettes 140 are loaded on the conveying vehicle V, and are conveyed to the panel feeding area 120 corresponding to one of the panel processing apparatuses 100.

The conveying vehicle V uses electric power as a driving source and moves along a rail, which is well known in the art.

A feeding/storing stage formed in a table shape, on which the panel cassette 140 is disposed, is installed on each of the panel storing area 1300 and the panel feeding area 120. A panel loading unit 150 such as a robot arm for withdrawing the panels one by one from the panel cassette 140 disposed on the stage is installed in the panel feeding area 120.

Referring to FIG. 17, the conveying process for conveying the panel to the corresponding panel processing apparatus using the panel conveying system will be briefly described.

The conveying process comprises the steps of loading the panel cassette disposed in the panel storing area and receiving a plurality of panels (201), conveying the panel cassette to the panel processing area (202), unloading the panel cassette in the panel processing area (203), and feeding the panel received in the panel cassette to the panel processing apparatus.

However, in the above-described panel conveying method, the conveying process is comprised of many steps, complicating the process and consuming time.

In addition, since an additional conveying system for conveying the panel that is processed in the panel processing apparatus should be set in the clean room, the process is further complicated, deteriorating the processing efficiency.

Furthermore, the installing of the stages, the conveying units, and the loading/unloading units necessitates an increase of the clean room space, thereby increasing the manufacturing costs of the clean room.

In order to process a large-sized panel, the storing, feeding, and conveying areas should be increased in response to the large-sized panel. This also necessitates an increase of the clean room space, deteriorating the space efficiency of the clean room.

In addition, since the conveying vehicle is designed to move only between predetermined sections such as between the storing, feeding, and conveying areas, it is difficult to expect that the vehicle performs additional functions.

SUMMARY OF THE INVENTION

Therefore, the present invention has been made in an effort to solve the above-described problems.

It is an objective of the present invention to provide system and method for conveying a panel that can reduce the number of conveying steps and save space where it is applied.

To achieve the object, the present invention provide a panel conveying system comprising a panel cassette for receiving a plurality of panels; and a conveying vehicle for conveying the panel cassette, wherein the conveying vehicle comprises a loading/unloading unit installed on the main body to load and/or unload the panel cassette on and/or from a panel processing unit; a panel conveying unit installed on the main body to feed and/or collect the panels to and/or from a panel processing area; and a lifting unit supporting the panel cassette in the main body.

In another aspect of the present invention, there is provided a panel conveying method comprising the steps of loading a panel cassette receiving panels in a panel storing area; conveying the panel cassette to a panel processing area; and feeding the panels received in the panel cassette from a conveying vehicle to a panel processing device.

In another aspect of the present invention, there is provided a panel conveying method comprising the steps of collecting processed panels into a panel cassette loaded on a conveying vehicle; conveying the panel cassette in which the processed panels are collected to a panel storing area; and unloading the panel cassette loaded on the conveying vehicle to the panel storing area.

BRIEF DESCRIPTION OF THE DRAWINGS

The accompanying drawings, which are included to provide further understanding of the invention and are incorporated in and constitute a part of this application, illustrate embodiment(s) of the invention, and together with the description serve to explain the principles of the invention. In the drawings:

FIG. 3 is displaced to a position where it can feed a panel in a panel feeding area;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
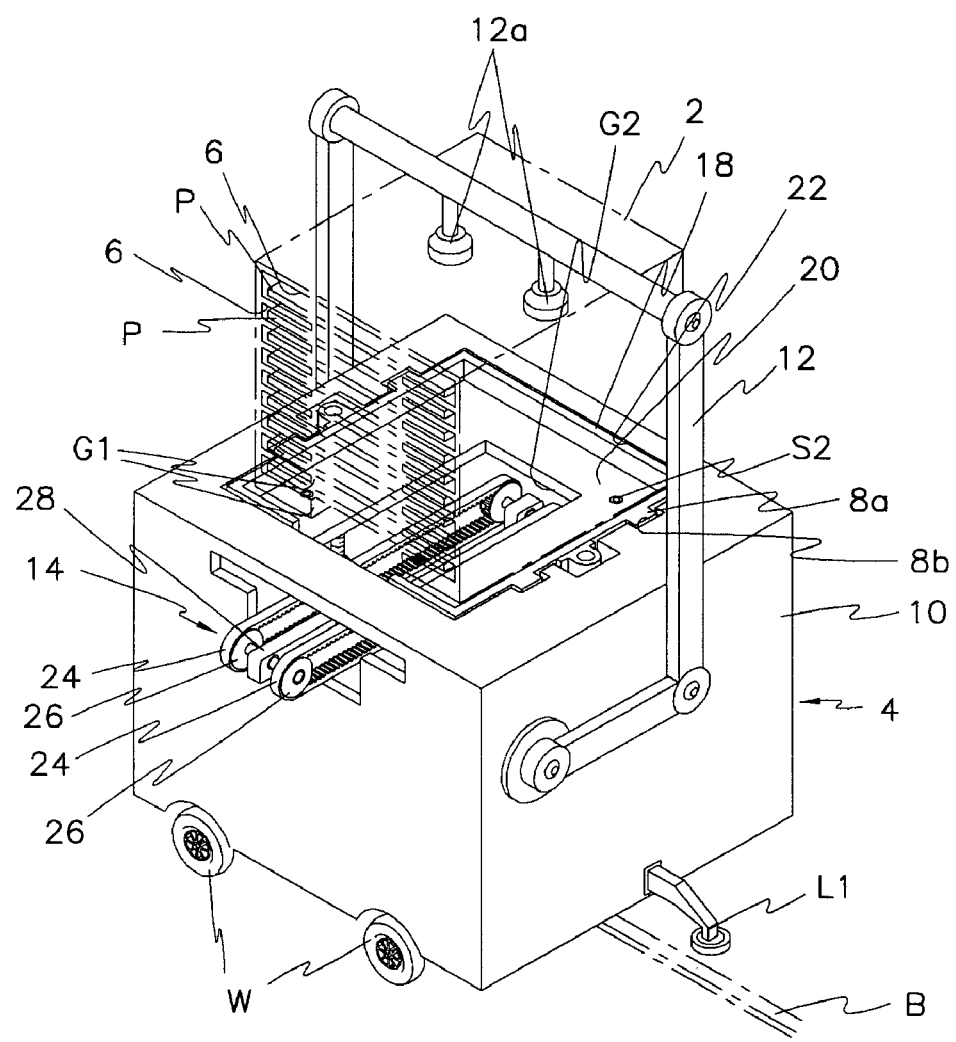
FIG. 1 is a perspective view of a panel conveying system according to an embodiment of the present invention.
Figure 2:
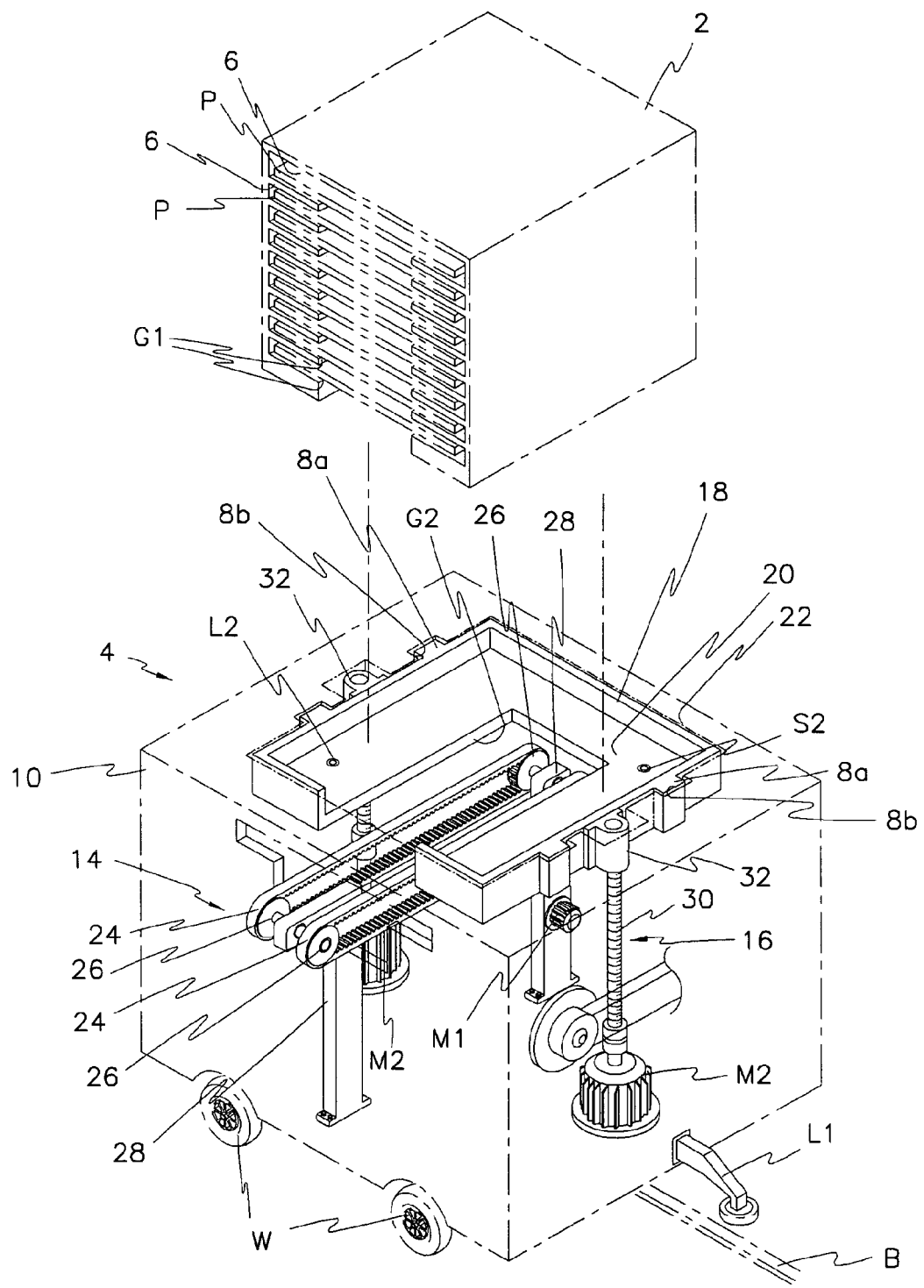
FIG. 2 is a perspective view of an inner structure of a panel conveying system depicted in FIG. 1.
Figure 3:
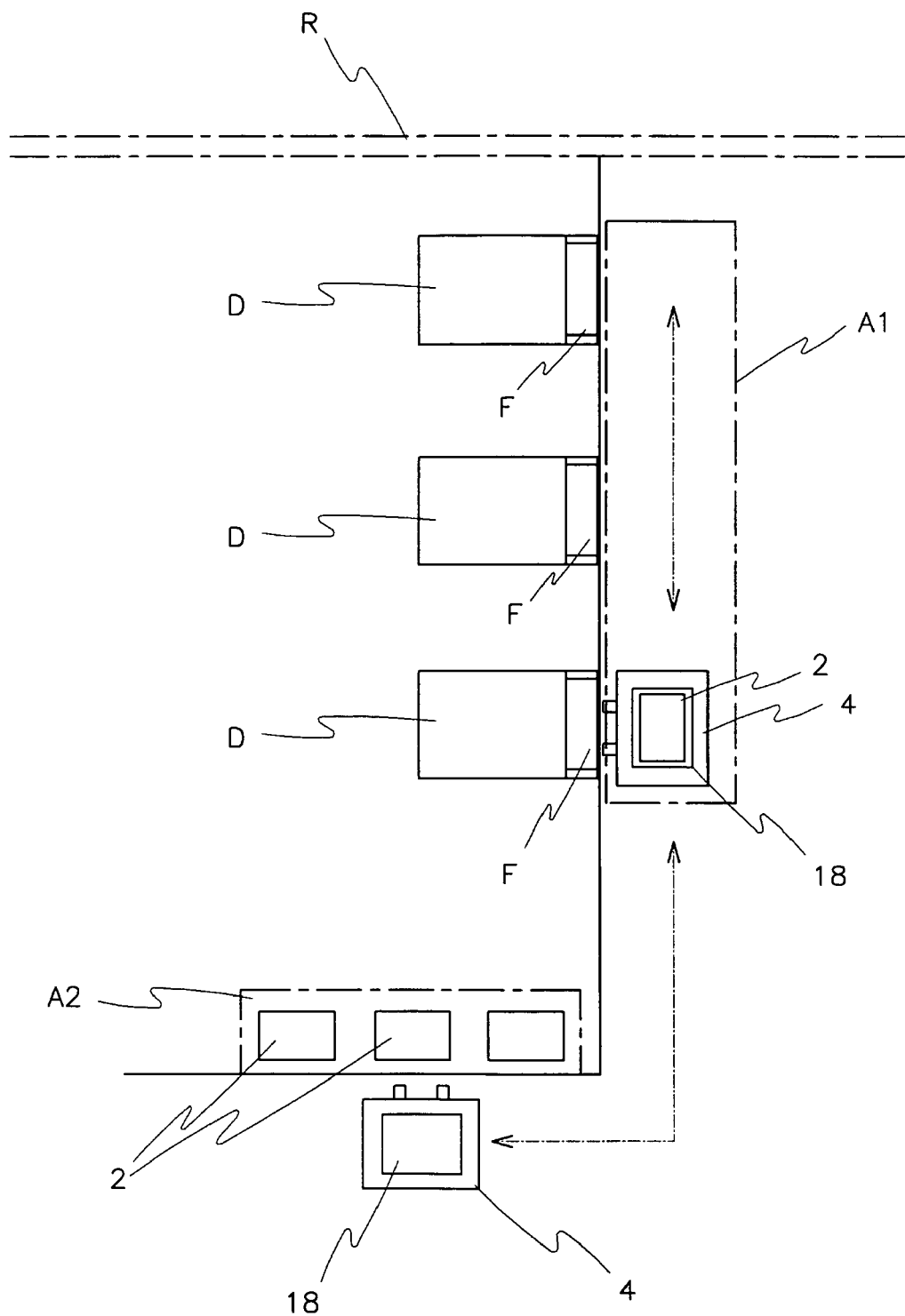
FIG. 3 is a plane view of a panel conveying system that is installed in a clean room according to an embodiment of the present invention.

Referring to FIGS. 1 through 3, the inventive panel conveying system comprises a panel cassette 2 for receiving a plurality of panels P, and a conveying vehicle 4 for conveying the panel cassette to a panel processing area.

As shown in FIG. 3, a conveying path is formed in a "⌐"-shape. That is a panel feeding area A1 corresponding to a panel processing apparatus D is spaced from a panel storing area A2 for storing the panels P in the "⌐"-shape. The conveying vehicle 4 moves along the ⌐-shaped path.

A roller conveying unit F is set on the panel processing apparatus D so that the panels P can be loaded into the conveying vehicle 4 and then supplied into the processing apparatus D.

Figure 4:
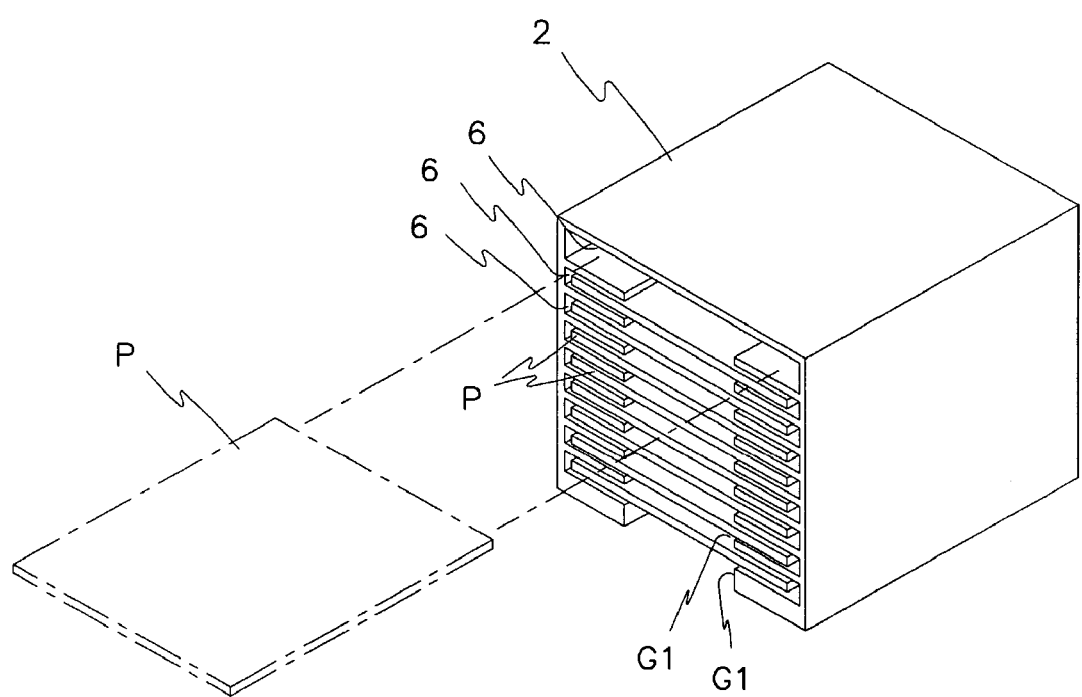
FIG. 4 is a perspective view of a panel cassette depicted in FIG. 1.
Figure 5:
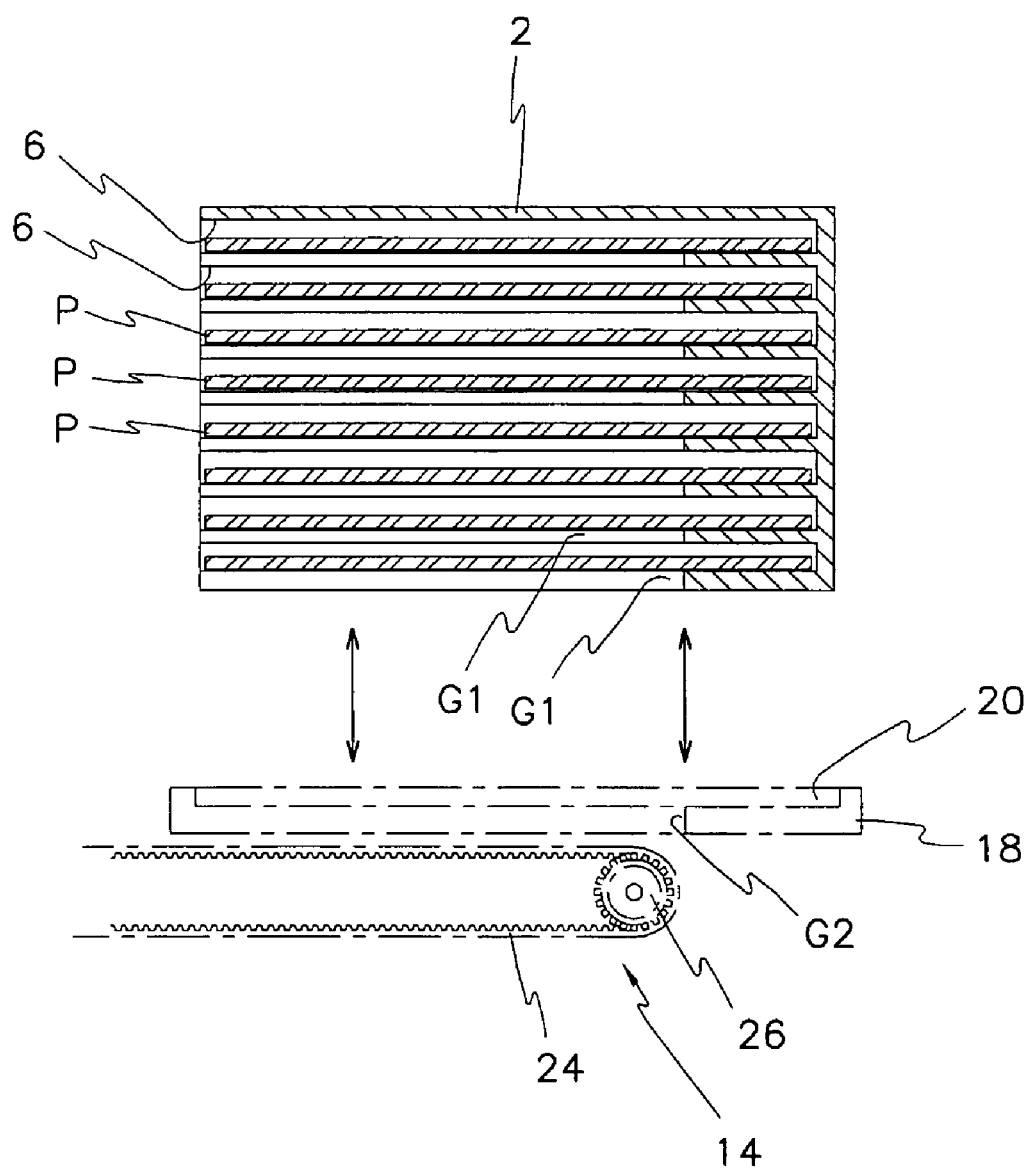
FIG. 5 is a sectional view of an internal structure of FIG. 4.

The panel cassette 2 functions as a tray for receiving and conveying the panels P. That is, as shown in FIGS. 4 and 5, the panel cassette 2 is formed in a box shape, being provided with a plurality of receiving grooves 6 for receiving the panels P. That is, the panels P are loaded in the panel cassette 2.

The receiving groove 6 is provided with a guide groove G1 so that the panel can be withdrawn by a panel feeding unit 16 such as the conveying vehicle 4. A size of the guide groove 8 is determined in a range in which the panel conveying unit 16 can be disposed to be able to withdraw the panel P through the guide groove 8 in response to the panel receiving groove 6.

The panel cassette 2 is formed of synthetic resin that is not easily broken by outer load or impact, disallowing scratches or static electricity. The panel cassette 2 can be formed through a molding process.

The panel cassette 2 receiving the panels P is conveyed from the storing area A2 of the clean room R to the panel feeding area A1 in response to the panel processing apparatus D by the conveying vehicle 4. The conveying vehicle 4 will be described hereinafter in more detail.

The conveying vehicle 4 comprises a movable main body 10, a loading/unloading unit 12 for loading and unloading the panel cassette 2 on and from the main body 10, a panel conveying unit 14 for feeding the panels P received in the panel cassette 2 to the panel processing apparatus D, and a lifting unit 16 for varying the position of the panel cassette 2 to allow the panel conveying unit 14 to withdraw the panels one by one. In this embodiment, as shown in FIG. 2, a loading plate 18 for detachably supporting the panel cassette 2 is installed in the lifting unit 16.

The main body 10 is provided with a space in which the loading plate 18, the panel conveying unit 14 and the lifting unit 16 are installed. That is, as shown in FIG. 2, the main body 10 is formed in a box shape.

The main body 10 is designed to move between predetermined sections in the clean room R. In this embodiment, as shown in FIGS. 1 and 2, a guide bar B is installed on a bottom of the clean room R in response to the moving path of the main body 10. The main body 10 is provided with a sensor S1 for detecting a position of a guide bar B. The sensor S1 may be formed of an infrared sensor or an optical sensor. The main body 10 moves in accordance with the detecting operation of the sensor S1.

To allow the main body 10 to move along the predetermined path in the clean room R, as shown in FIG. 1, wheels are installed as shown in FIG. 1. The wheels are driven by, for example, an electric motor.

Instead of wheels, other driving structures may be used to move the main body 10.

The main body may be formed of metal or synthetic resin through, for example, a molding process.

The loading plate 18 supports the panel cassette 2 such that the panel cassette 2 can be detachable from the main body 10 in a predetermined position. In this embodiment, as shown in FIG. 2, the loading plate 18 is provided with a supporting groove 20 corresponding to the bottom of the panel cassette 2 and is positioned in response to a top opening 22 of the main body 10.

Figure 7:
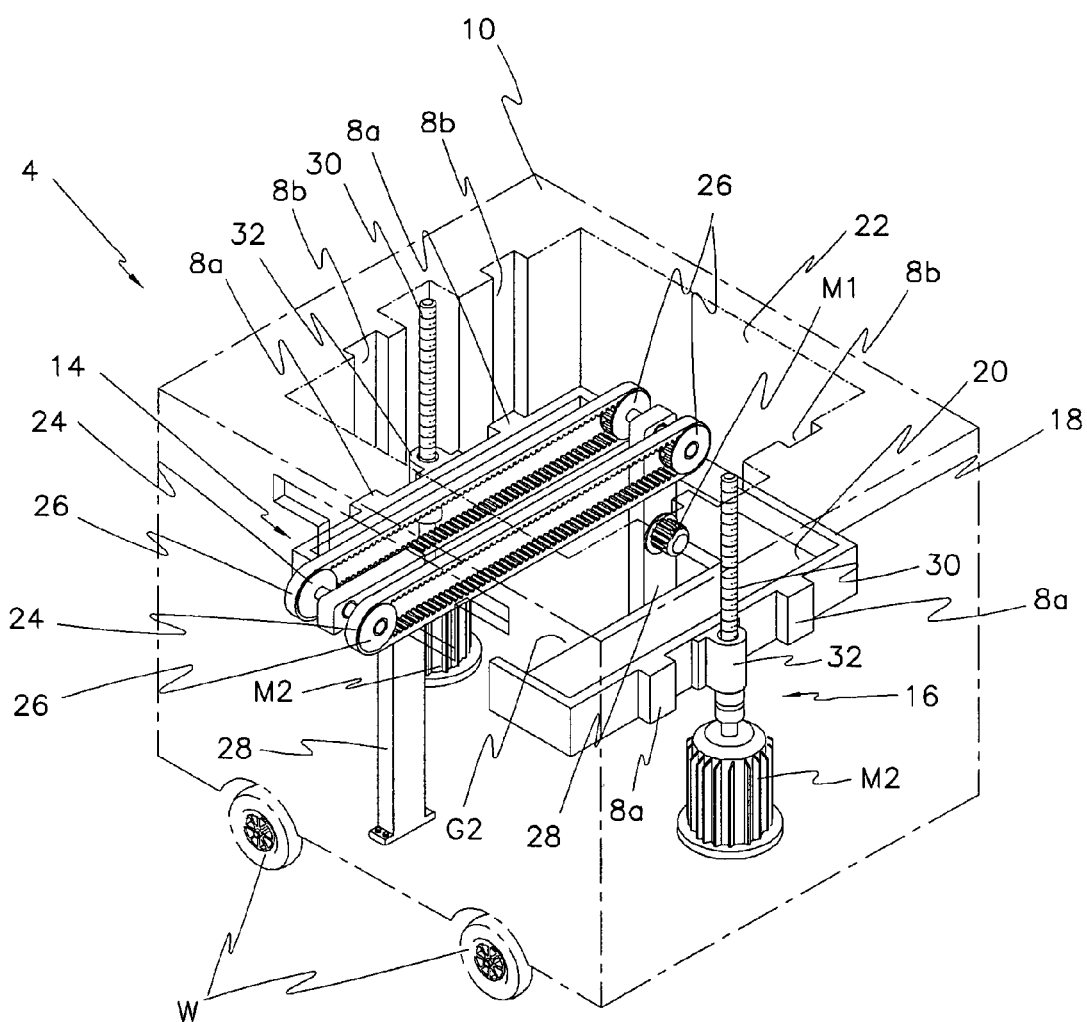
FIG. 7 is a perspective view illustrating a structure for varying a position of a loading plate of FIG. 2 by a lifting unit.

The loading plate 18 is provided at a circumferential edge with a square-shaped projection 8a and a groove 8b so as to, as shown in FIG. 7, allow the lifting unit 16 to guide the vertical motion in the opening of the main body 10.

The loading plate 18 is further provided with a guide groove G2 having a shape identical to the guide groove G1 of the panel cassette 2 to allow the panel conveying unit 14 to pass therethrough (see FIG. 2).

A sensor 32 is installed on a surface of the supporting groove 20 of the loading plate 18 to detect the installation of the panel cassette 2. The sensor 32 may be formed of an optical sensor or a limit switch.

Figure 6:
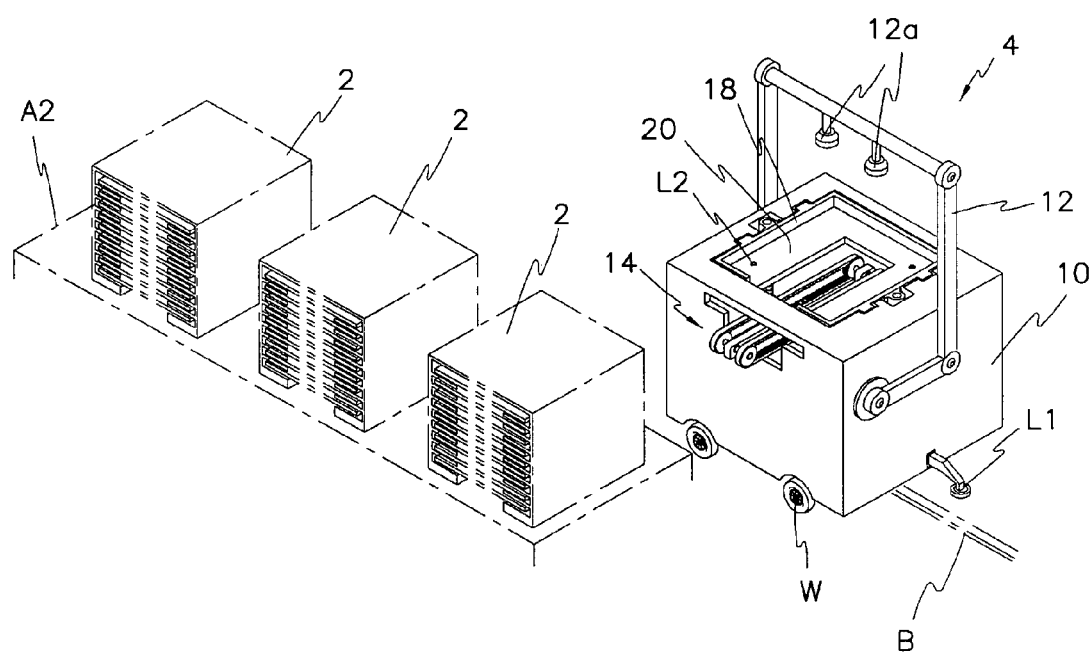
FIG. 6 is a perspective view illustrating a state wherein a conveying vehicle of FIG. 3 is installed in a panel storing area.

The loading/unloading unit 12 is, as shown in FIG. 6, functions to easily load the panel cassette 2 on the main body 10 in the panel storing area A2. In this embodiment, as shown in FIG. 1, the loading/unloading unit 12 is formed of two arms between which the main body 10 is located. Absorption members 12a are installed on a connecting member between the arms for the absorption of the panel cassette 2.

Since the loading and unloading unit 12 can be formed according to a well-known technology, the detailed description thereof will be omitted herein.

The conveying unit 14 functions to feed the panels loaded in a vertical direction from the panel cassette 2 to the panel processing device D. In this embodiment, as shown in FIG.

2, the conveying unit 14 comprises two sets thereof, each having a timing belt 26 and a pulley 26.

As shown in FIG. 2, a supporting member 28 such as a bearing block for rotatably supporting the pulleys 26 is provided. A power source M1 such as a motor is installed on the supporting member to transmit torque to the pulleys 26 by a chain-sprocket assembly or a gear-to-gear engagement.

Figure 8:
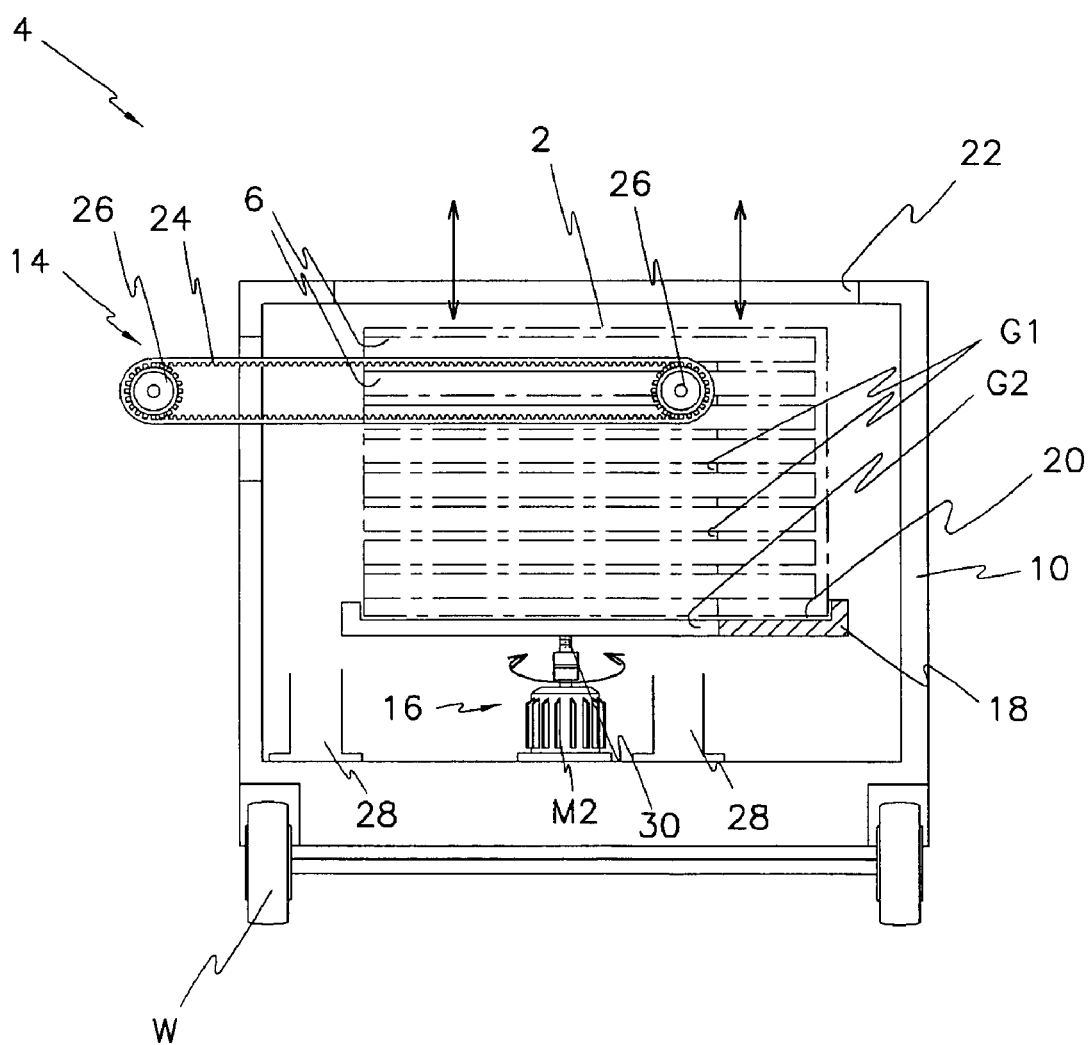
FIG. 8 is a sectional view of FIG. 7.

The panel conveying unit 14 is horizontally projected corresponding to a panel withdraw side as shown in FIG. 8, so that the panel P can be easily supplied to the conveying part F of the panel processing device D.

A lifting section of the belt 24 stretched by the pulleys 26 is lengthened in a range where it can effectively support and move the panel P.

The belt 24 is surface-processed or coated having concave and convex portions to reduce the contacting area with the panel P and prevent the panel P from being scratched.

Although the conveying unit 14 is comprised of the belt 24 and the pulleys 26, the present invention is not limited to this case.

For example, rollers to transfer the panel P can be provided.

Meanwhile, the loading plate 18 is designed to vertically move in the main body 10 by the lifting unit 16. In this embodiment, two rotational shafts 30 each provided with a screw are connected to the loading plate 18. The rotational shafts 30 are driven by a driving source M2 such as a motor, and its rotational motion is converted into a linear motion to displace the loading plate 18.

That is, as shown in FIG. 2, the rotational shafts 30 are connected to the driving source M2 fixed on the bottom of the main body 10 to guide the vertical movement of the loading plate 18.

A guide block 32 is installed on the loading plate 18, and the rotational shafts 30 are screw-coupled in a screw groove formed on the guide block 32. The screw coupling of the guide block 32 to the rotational shafts 30 allows for more precision movement of the loading plate 18, reducing abrasion and increasing endurance. The screw may be formed as a ball screw, a triangular screw, or a square screw.

When the panel conveying unit 14 supplies the panels P received in the panel cassette 2 to the conveying part F of the panel processing device D, the lifting unit 16 displaces the loading plate 18 to feed the panels one by one in the order from the lowermost panel.

Figure 9:
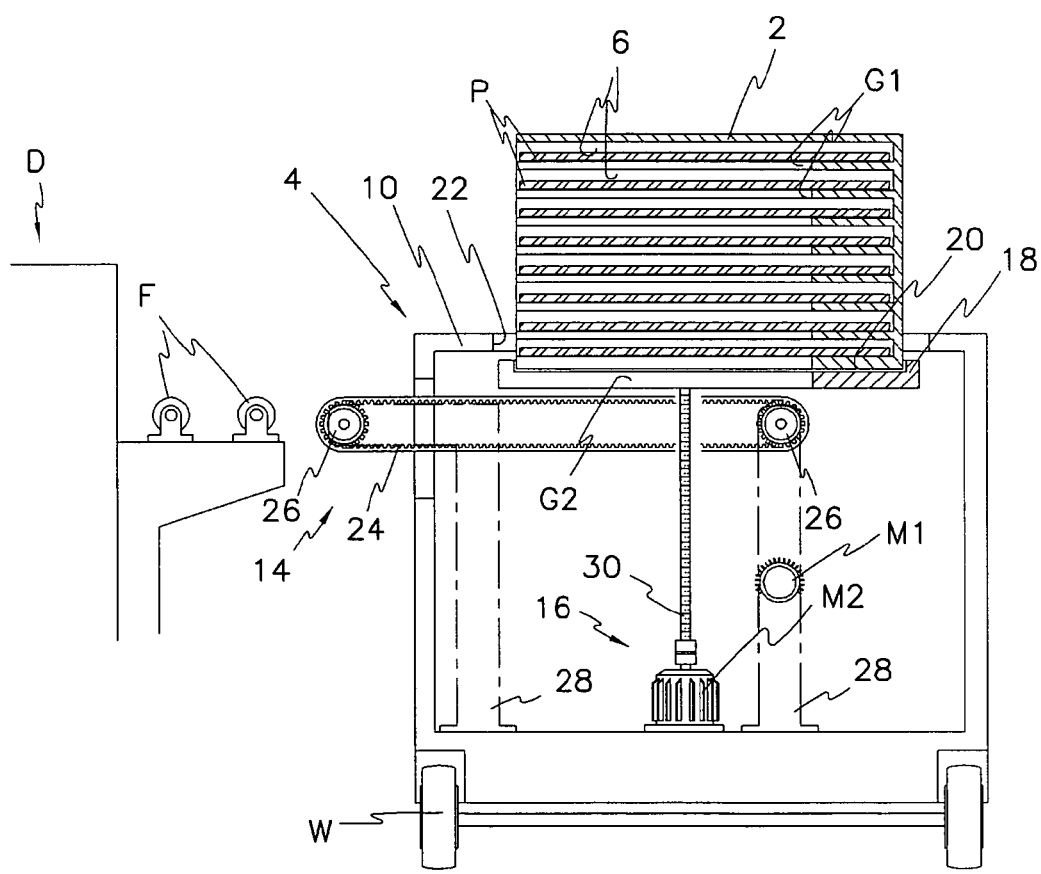
FIG. 9 is a sectional view illustrating a state wherein a conveying vehicle
Figure 10:
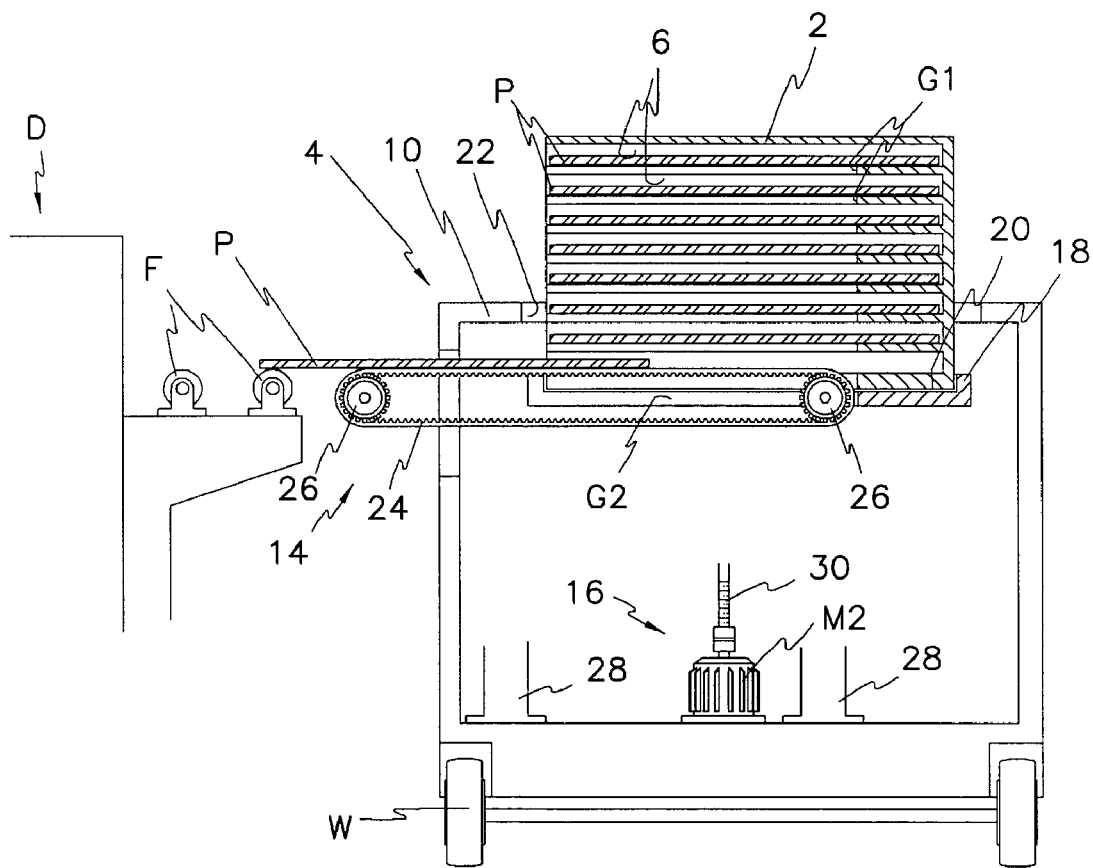
FIG. 10 is a sectional view illustrating a state wherein a panel is supplied by a panel conveying unit as a position of a cassette is varied by a lifting unit.
Figure 11:
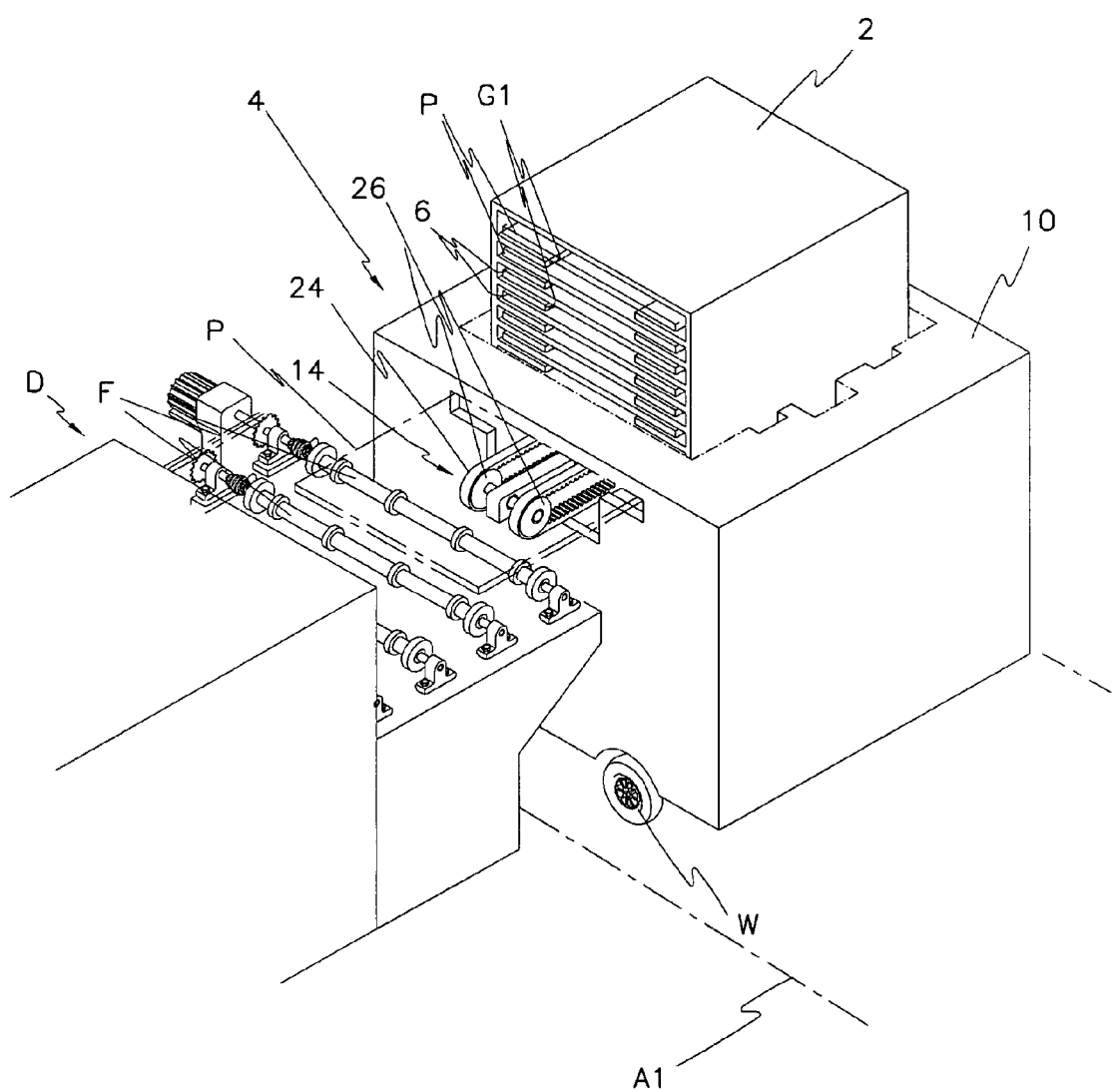
FIG. 11 is a perspective view of FIG. 10.

That is, as shown in FIG. 9, in a state where the panel cassettes 2 are loaded on the loading plate 18, when the rotational shafts 30 rotate in a direction, as shown in FIGS. 10 and 11, the loading plate 18 moves downward in the main body 10 and is displaced to move the panel P received in the lowermost receiving groove 6 of the panel cassette to the surface of the belt 24 of the panel conveying unit 14.

At this point, the lifting means moves the loading plate 18 such that the panel P received in the lowermost groove 6 of the panel cassette 2 can only contact the surface of the belt 24 in the receiving groove 6, spacing away from the bottom of the receiving groove 6.

The panel P disposed on the surface of the belt 24 is fed to the conveying part F of the panel processing device D as the belt 24 rotates by the pulleys 26 driven by the driving source M1.

Figure 12:
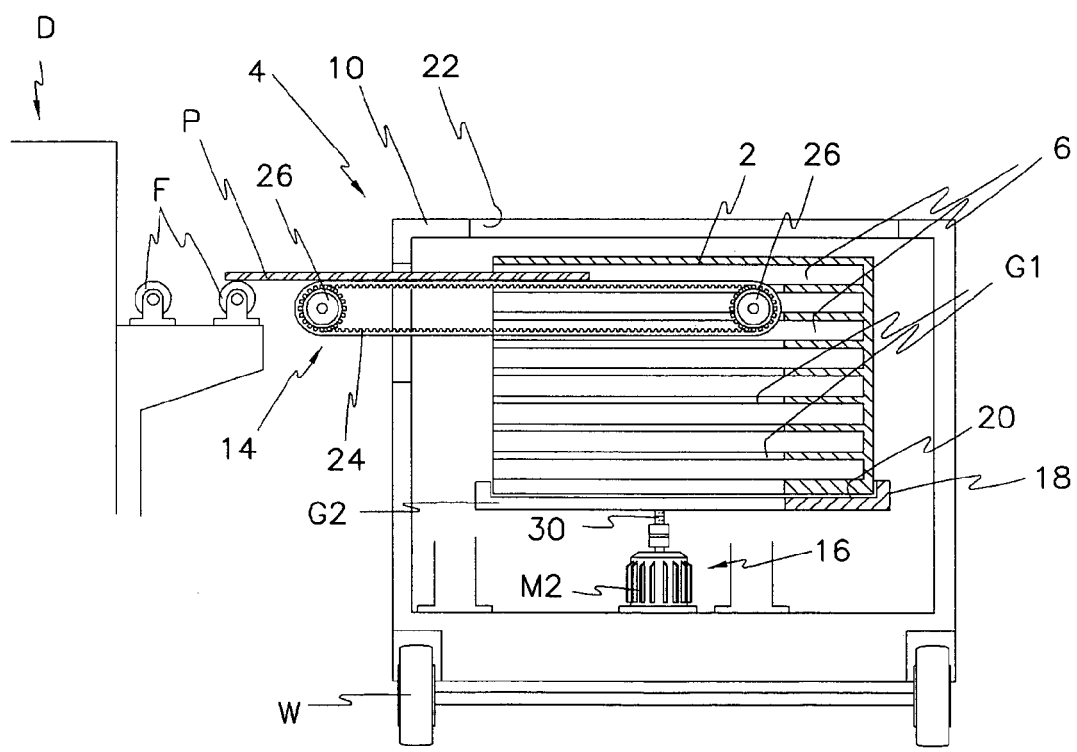
FIG. 12 is a sectional view illustrating a state wherein a panel is supplied to a top receiving groove formed on a cassette by a lifting unit and a panel conveying unit depicted in FIG. 10.

When the panel P is fed to the conveying part F, the lifting unit 16 is identically operated to the above, thereby successively feeding the panels in the order from the lowermost one to the uppermost one (see FIG. 12).

A sensor such as an optical sensor or a limit switch may be installed in the main body 10 to detect the position of the loading plate, thereby controlling the loading plate 18 to allow the lifting unit 16 to displace the loading plate on a position corresponding to each receiving groove 6 of the panel cassette 2. Since the control method according to the detection of the sensor is well known in the art, a detailed description thereof will be omitted herein.

In the above description, although the lifting unit 16 has the rotational shafts 30 screw-coupled to the loading plate 18 to vertically move the loading plate 18, the present invention is not limited to this case.

For example, a cylinder may be installed in the main body 10 so that the loading plate 18 can vertically move by a linear motion of a piston rod of the cylinder. That is, the lifting unit can be formed of a variety of structures.

A panel conveying method using the above-described panel conveying system will be described hereinafter in more detail with reference to the accompanying drawings.

Figure 13:
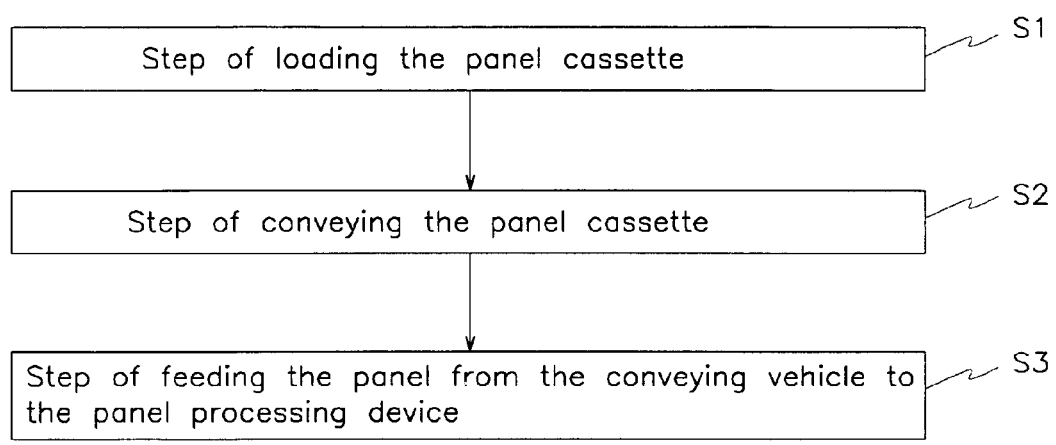
FIG. 13 is a flowchart illustrating a panel feeding process according to an embodiment of the present invention.

FIG. 13 shows a flowchart illustrating a panel conveying method according to an embodiment of the present invention.

The inventive panel conveying method comprises the steps of loading the panel cassette receiving the panels in the panel storing area (S1), conveying the panel cassette to the panel processing area (S2), and feeding the panels received in the panel cassette from the conveying vehicle to the panel processing device (S3).

In Step S1, as shown in FIG. 6, the panel cassette 2 located in the panel storing area A2 is loaded on the loading plate 18 of the conveying vehicle 4. That is, the loading/unloading unit 12 of the main body 10 absorbs the panel cassette 2 disposed in the panel storing area A2 and loads the same on the loading plate 18 as shown in FIG. 1.

At this point, the receiving grooves 6 of the panel cassette 2 are disposed corresponding to the panel withdraw side of the main body 10 as shown in FIG. 9. The panel cassette 2 is loaded in a state where the panels are received in the respective receiving grooves 6.

When the panel cassette 2 is loaded on the conveying vehicle 4, the panel cassette 2 is conveyed to the panel feeding area A1 where the panels P can be fed to the panel processing device D.

In Step S2, as shown in FIG. 1, the guide bar B for guiding the movement of the conveying vehicle 4 is installed on the bottom of the clean room R and the sensor S1 installed in the main body 10 detects the guide bar B so that the conveying vehicle 41 can move along the predetermined path by the wheels to convey the panel cassette 2 to the panel feeding area A1.

When the conveying vehicle 4 on which the panel cassette is loaded is located on the panel feeding area A1 corresponding to the panel processing area D, the panels P are fed to the conveying part F of the panel processing device D.

In Step S3, the loading plate 18, the panel conveying unit 14, and the lifting unit 16 are operated to feed the panel from the conveying vehicle 4.

That is, as shown in FIG. 10, the lifting unit 14 is operated to move the loading plate 18 downward as shown in FIG. 10 so that the panel P being received in the lowermost receiving groove 6 of the panel cassette 2 loaded on the conveying vehicle 4 can move by contacting the belt 24 of the panel conveying unit 14 as shown in FIG. 9.

In the above state, as the panel conveying unit 14 operates, the panel P is horizontally fed to the conveying part F of the panel processing device D, and moves to the panel withdraw side of the main body as shown in FIG. 10. The panel P loaded in the conveying unit F is fed to the panel processing device D and is processed through a series of processes.

When the panel P received in the lowermost receiving groove 6 of the panel cassette 2 is fed to the conveying part F, the loading plate withdraws the panels received in the panel cassette 2 one by one from the lowermost side while gradually moving downward in response to the receiving grooves 6, by the lifting unit 16. As a result, all of the panels P from the lowermost groove to the uppermost groove of the cassette 2 are effectively fed to the conveying part F as shown in FIG. 12.

Accordingly, when the above-described inventive conveying vehicle 4 is used, the panels P can be conveyed and fed from the panel feeding area A1 to the panel processing device D.

Although the feeding of the panels P received in the panel cassette 2 to the panel processing device D is realized by the conveying vehicle 4, the present invention is not limited to this case.

For example, the panel conveying system of the present invention can be used to collect the processed panels P1 and convey the collected panels to the panel storing area.

Figure 14:
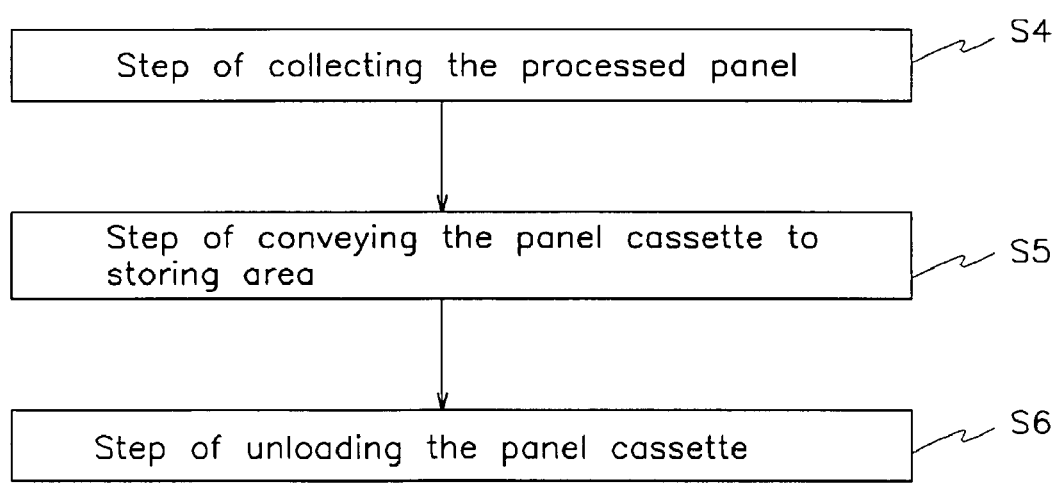
FIG. 14 is a flowchart illustrating a processed panel collecting process according to an embodiment of the present invention.
Figure 15:
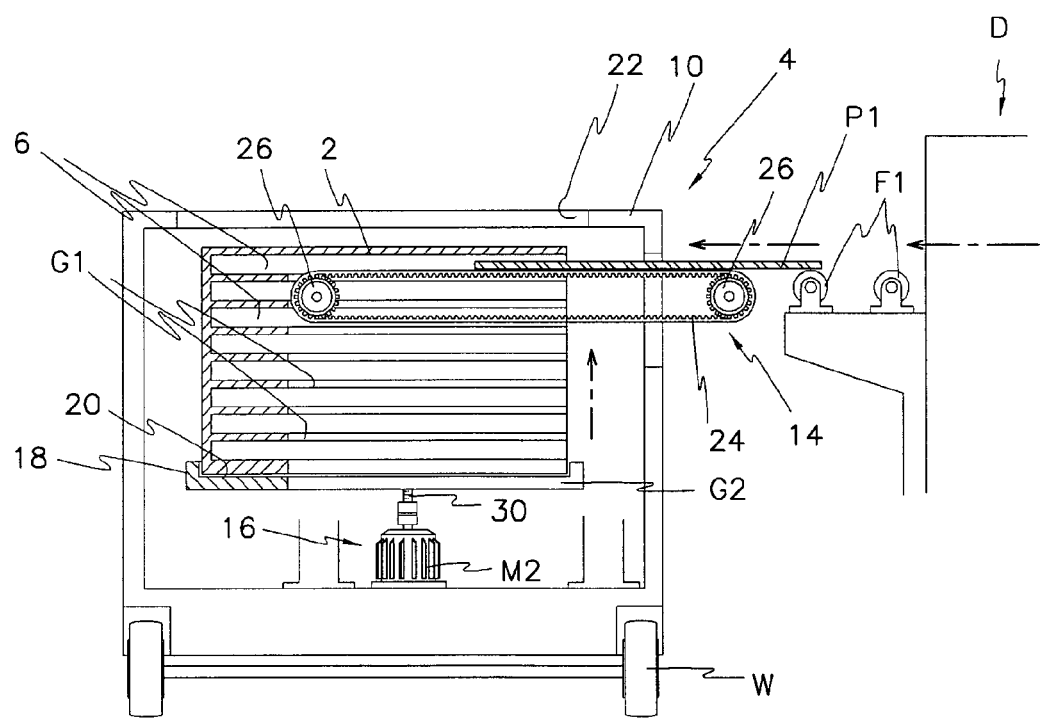
FIG. 15 is a sectional view illustrating a processed panel collecting process of FIG. 14.
Figure 16:
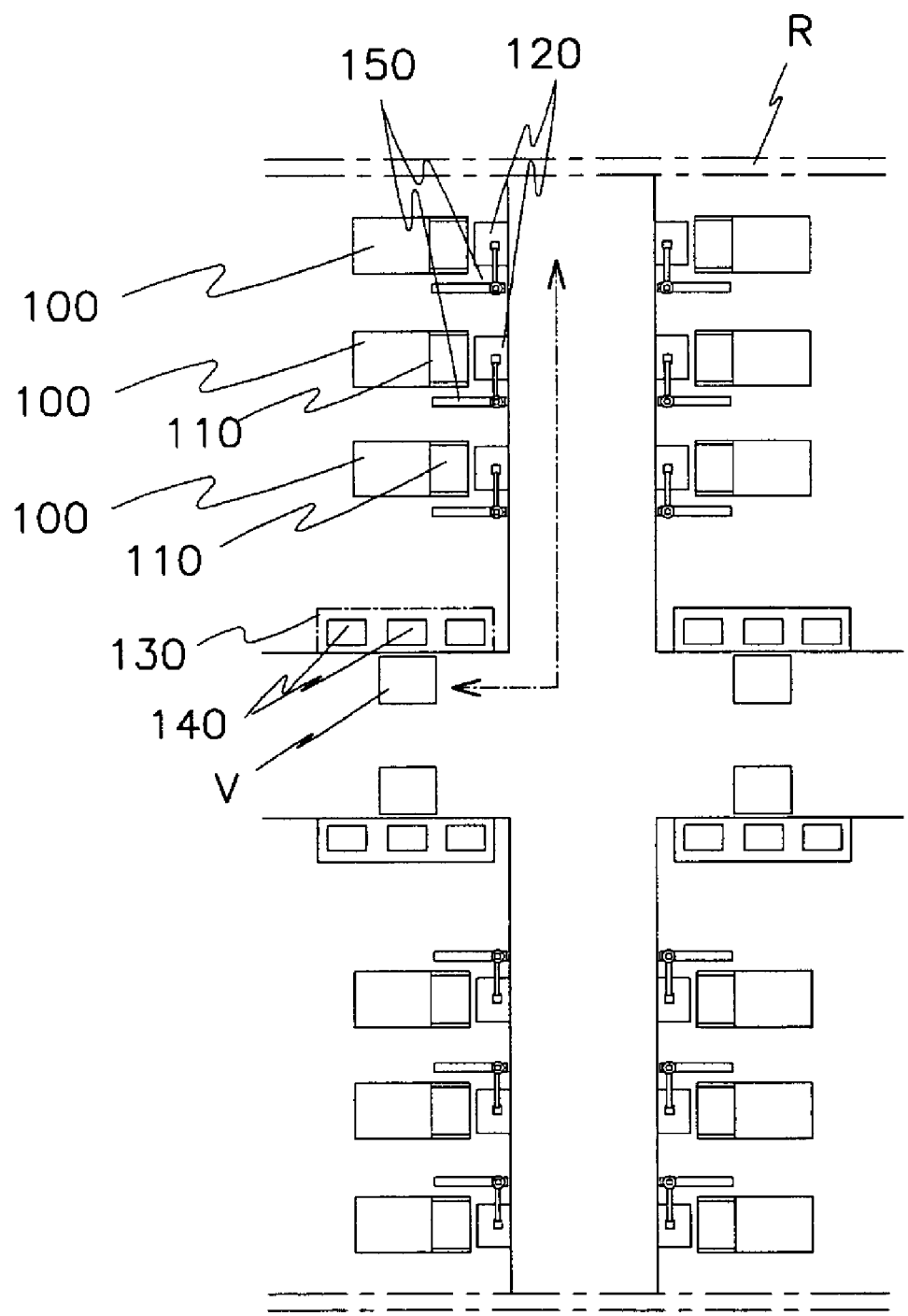
FIG. 16 is a plane view of a conventional panel conveying system.
Figure 17:
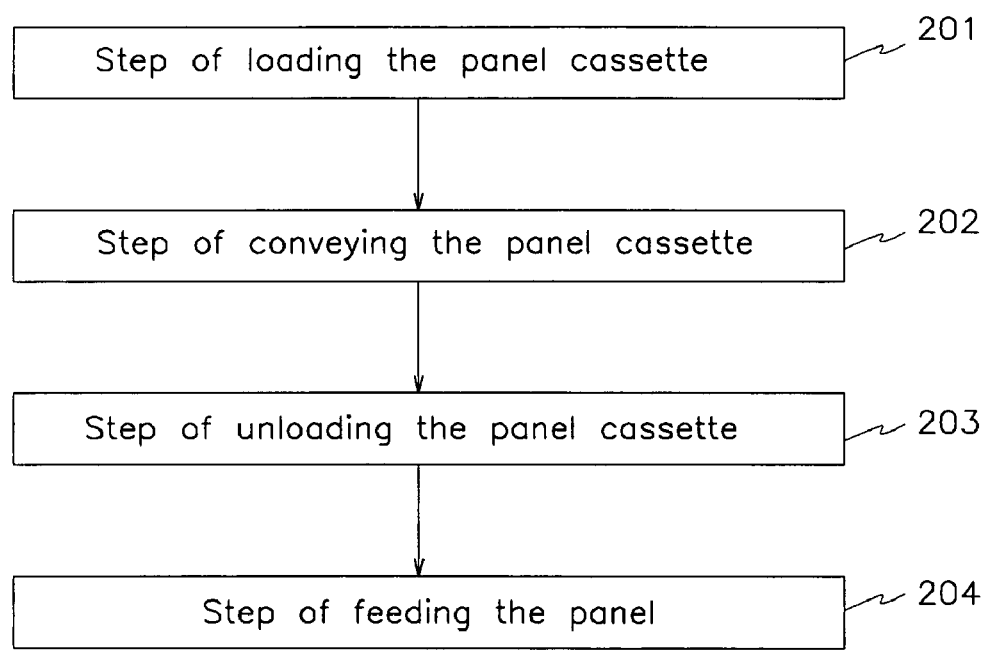
FIG. 17 is a flowchart illustrating a conventional panel conveying process.

FIG. 14 shows a flowchart for illustrating a processed panel collecting method.

The processed panel collecting method comprises the steps of collecting the processed panels into the panel cassette disposed on the conveying vehicle (S4, conveying the panel cassette in which the processed panels are collected to the panel storing area (S5), and unloading the panel cassette loaded on the conveying vehicle to the panel storing area (S6).

In Step S4, When the panels P1 processed in the panel processing device D are located on an unloading conveying part F1 of the panel processing device D, a predetermined collecting section is formed such that the conveying vehicle 4 is located in the collecting area and the panel collecting process is performed in an opposite direction to that of the panel feeding process. That is, the panel conveying unit 14 receives the processed panels P1 disposed on the unloading side of the panel processing device, being operated in a direction shown in the drawing. The panel conveying unit 14 moves the panels P1 to the receiving area of the panel cassette 2 to receive the panels P1 into the receiving grooves 6 of the panel cassette 2.

At this point, the panel cassette 2 receives the panels in an opposite process to the panel feeding process. That is, the lifting unit 16 gradually moves the panel cassette 2 upward so that the panels P can be received in the receiving grooves 6 in the order from the uppermost one to the lowermost one.

When the processed panels P1 are collected, the conveying vehicle 4 moves along a panel collecting path in Step S5 to convey the panels to the panel storing area. When the panel cassette 2 loaded on the conveying vehicle 4 moves to the panel storing area, the loading/unloading unit 12 is operated to unload the panel cassette 2 in the panel storing are in Step S6, thereby completing the panel collecting process.

Although the panel conveying system of the present invention is designed to convey the processed panels to the panel storing area, the present invention is not limited to this case but is also designed to convey the processed panels P1 to another processing unit.

According to the present invention, since the panel conveying system is designed to convey the panels to the processing unit and to collect the processed panel, the panel conveying efficiency can be remarkably improved.

In addition, since the conveying vehicle is used to feed and collect the panels in response to the panel processing and storing areas, a variety of devices such as a buffer unit, a stage, robot arms, and the like, which have been used in the prior art, are not required, thereby saving working space and manufacturing costs of the clean room.

Furthermore, since the structures of the panel conveying unit and the lifting unit are designed to be simple, manufacturing costs thereof can be saved.

In addition, since the panel feeding/collecting process is direction realized on the conveying vehicle, working efficiency and processing efficiency can be remarkably improved.

It will be apparent to those skilled in the art that various modifications and variations can be made in the present invention. Thus, it is intended that the present invention covers the modifications and variations of this invention provided they fall within the scope of the appended claims and their equivalents.

What is claimed is:

1. A panel conveying system comprising
   a panel cassette for receiving a plurality of panels, and
   a conveying vehicle for conveying the panel cassette,
   wherein the conveying vehicle comprises:
   a main body;
   a loading/unloading unit installed on the main body to load and/or unload the panel cassette on and/or from the conveying vehicle;
   a panel conveying unit installed on the main body to feed and/or collect the panels to and/or from a panel processing area; and
   a lifting unit including a loading plate for removably supporting the panel cassette in the main body, the loading plate being selectively positionable with respect to the panel conveying unit such that the panels can be fed to and/or collected from the panel cassette by the panel conveying unit one panel at a time, the loading plate of the lifting unit including a guide groove adapted to allow the panel conveying unit to pass therethrough.

2. The panel conveying system of claim 1, wherein the panel conveying unit is formed of a pair of belt/pulley units or rollers to horizontally move the panels.

3. The panel conveying system of claim 1, wherein the lifting unit is designed to move the loading plate and the panel cassette in a generally vertical direction.

4. The panel conveying system of claim 1, wherein the lifting unit is designed to move the panel cassette such that the panels received in the panel cassette can be withdrawn one by one in the order from the lowermost one to the uppermost one.

5. The panel conveying system of claim 1, wherein the lifting unit is designed to move the panel cassette such that the panels can be received in a panel receiving area of the panel cassette one by one in the order from the uppermost side to the lowermost side.

6. The panel conveying system of claim 1, wherein the panel cassette is provided with a panel receiving area in which the panels can be stacked with a space between them.

7. The panel conveying system of claim 6, wherein the panel receiving area is provided with a plurality of grooves for horizontally receiving the panels.

8. The panel conveying system of claim 1 wherein the panel cassette includes a plurality of receiving grooves, each receiving groove adapted to removably receive a panel, and each receiving groove including a guide groove adapted to receive the panel conveying unit.

* * * * *